United States Patent
Huang et al.

(10) Patent No.: US 9,576,893 B2
(45) Date of Patent: Feb. 21, 2017

(54) SEMICONDUCTOR STRUCTURE AND SEMICONDUCTOR FABRICATING PROCESS FOR THE SAME

(71) Applicant: Taiwan Semiconductor Manufacturing Company, Ltd., Hsin-Chu (TW)

(72) Inventors: Tsung-Min Huang, Taichung (TW); Chung-Ju Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 40 days.

(21) Appl. No.: 14/559,660

(22) Filed: Dec. 3, 2014

(65) Prior Publication Data
US 2015/0137376 A1 May 21, 2015

Related U.S. Application Data

(62) Division of application No. 13/674,887, filed on Nov. 12, 2012, now Pat. No. 8,927,413.

(51) Int. Cl.
| | | |
|---|---|---|
| *H01L 21/283* | (2006.01) | |
| *H01L 23/48* | (2006.01) | |
| *H01L 23/485* | (2006.01) | |
| *H01L 23/522* | (2006.01) | |
| *H01L 21/768* | (2006.01) | |
| *H01L 23/532* | (2006.01) | |

(52) U.S. Cl.
CPC ....... *H01L 23/5226* (2013.01); *H01L 21/7682* (2013.01); *H01L 21/76843* (2013.01); *H01L 21/76852* (2013.01); *H01L 21/76865* (2013.01); *H01L 21/76877* (2013.01); *H01L 21/76885* (2013.01); *H01L 23/481* (2013.01); *H01L 23/5329* (2013.01); *H01L 23/53238* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,259,160 B1* | 7/2001 | Lopatin | H01L 21/76801 257/750 |
| 6,403,461 B1* | 6/2002 | Tae | H01L 21/76807 257/E21.579 |
| 2004/0127023 A1* | 7/2004 | Chun | H01L 21/76807 438/653 |
| 2005/0127514 A1 | 6/2005 | Chen et al. | |
| 2012/0319279 A1 | 12/2012 | Isobayashi | |

\* cited by examiner

*Primary Examiner* — Robert Bachner
*Assistant Examiner* — Molly Reida
(74) *Attorney, Agent, or Firm* — Slater Matsil, LLP

(57) ABSTRACT

A semiconductor structure and a fabricating process for the same are provided. The semiconductor fabricating process includes providing a first dielectric layer, a transitional layer formed on the first dielectric layer, and a conductive fill penetrated through the transitional layer and into the first dielectric layer; removing the transitional layer; and forming a second dielectric layer over the conductive fill and the first dielectric layer.

20 Claims, 11 Drawing Sheets

SEMICONDUCTOR STRUCTURE AND SEMICONDUCTOR FABRICATING PROCESS FOR THE SAME

PRIORITY CLAIM AND CROSS-REFERENCE

This application is a divisional of U.S. patent application Ser. No. 13/674,887, entitled "Semiconductor Structure and Semiconductor Fabricating Process for the Same," filed on Nov. 12, 2012, which application is incorporated herein by reference.

FIELD

The present disclosure relates to a semiconductor structure and a fabricating process for the same. More particularly, it relates to a semiconductor structure having a damascene structure formed therein and a semiconductor fabricating process for forming the semiconductor structure.

BACKGROUND

In manufacture of an integrated circuit (IC), such as large scale integrated circuits (LSI) and ultra-large scale integration (ULSI) integrated circuits, a damascene process that eliminates the demands of a metal dry etch for forming conductive wiring and a dielectric gap fill has been commonly utilized to form interconnections, responsible for intercommunications among multiple stacked metallization layers in the semiconductor device in a back-end-of-line (BEOL) fabricating stage.

A typical damascene process involves steps of etching trenches or vias in a multi-layered planar dielectric layer, and then filling the trenches or vias with metal, such as aluminum or copper. After filling, the excess metal outside the trenches is planarized and polished by chemical mechanical polishing, so that metal is only left within the trenches to form conductive interconnections transmitting electronic signals. Often, the damascene process is generally classified into three categories including a via first trench last (VFTL) scheme, a trench first via last (TFVL) scheme and a self-aligned via first (SAVF) scheme.

In such damascene process, due to the fact that various composite isolation layers, such as hard mask layers and etch stop layers, usually having a relatively lower etch rate than those of dielectric layers nearby are vertically interlaid among dielectric layers, there yields a non-uniform etch selectivity distributed along a vertical profile for the multi-layered formed damascene structure. Accordingly after etching, there unavoidably forms an uneven non-vertical sidewall in the trenches which causes an irregular trench profile, in particular an upwardly narrowing tapered trench profile having a quite narrowing pattern around the top opening for the trench. Upon filling, a filling metal may be excessively deposited on the narrowing part around the top opening for the trench easily which causes the trench to be early sealed during filling process, resulting in an issue commonly known as a necking effect, or also known as a metal gap fill limitation.

As a trend that electronic devices continue to be smaller, less expensive, and more powerful, a critical concerned issue with respect to a resistive-capacitance (R×C) delay time characteristic dominating the circuit performance in IC for the electronic devices is correspondingly raised. Accordingly, the inter-metal dielectric layer or inter-layer dielectric layer is generally made of material has a dielectric constant to be as low as possible, such as an extremely low-k (ELK) material, so as to improve the R×C delay time characteristic and to well insulate the respective metallization parts for preventing crosstalk from each other that degrades device performance by slowing circuit speed.

Nevertheless, although an ELK material is involved in, another concerned issue is that dry etch plasma can always deteriorate the deposited ELK layer by forming a thin damaged layer with a relatively higher dielectric constant along the contacting edge of the etch plasma and dielectric inside the ELK layer, which increases the entire dielectric constant and correspondingly impacts and increases the entire capacitance for the deposited ELK layer. Hence, there arises another issue that an overall R×C delay performance for the finalized semiconductor device containing the damaged ELK layer may be correspondingly affected and worsened.

With the miniaturized development for semiconductor fabricating technology for sub-micron, or even for 28 mn, 20 nm or nodes beyond semiconductor technology, it is anticipatable that there will encounter more and more difficulties in the aspect pertaining metal gap filling limitation and high Rs concern.

There is a need to solve the above deficiencies/issues.

SUMMARY

In accordance with one aspect of the present disclosure, it is provided that a semiconductor fabricating process includes providing a first dielectric layer, a transitional layer formed on the first dielectric layer, and a conductive fill penetrated through the transitional layer and into the first dielectric layer; removing the transitional layer; and forming a second dielectric layer over the conductive fill and the first dielectric layer.

In accordance with another aspect of the present disclosure, it is provided that a semiconductor damascene structure includes a first dielectric layer; and a second dielectric layer formed on the first dielectric layer and having a material dielectric constant and a processed dielectric constant, wherein the material dielectric constant and the processed dielectric constant have a magnitude difference having an absolute value less than 0.3.

In accordance with another aspect of the present disclosure, it is provided that a semiconductor structure includes a first dielectric layer; a second dielectric layer formed on the first dielectric layer; a conductive filling having an upper part penetrated through the second dielectric layer, and a lower part penetrated into the first dielectric layer; a first barrier layer formed between the lower part and the first dielectric layer; and a second barrier layer formed between the upper part and the second dielectric layer, wherein the first barrier layer and the second barrier layer are made of different materials.

In accordance with another aspect of the present disclosure, it is provided that a semiconductor structure includes a dielectric layer; an intermediate sacrificial layer formed on the dielectric layer; and a conductive fill formed in the intermediate sacrificial layer and the dielectric layer.

The present disclosure may best be understood through the following descriptions with reference to the accompanying drawings, in which:

DETAILED DESCRIPTION

Figure 1:
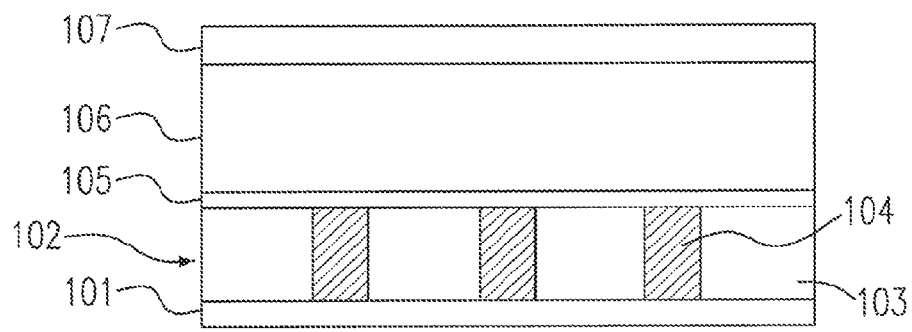
FIG. 1 is a schematic diagram illustrating an initial structure for the semiconductor structure fabricated in accordance with the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art front this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

A deposition scheme involved in the present disclosure may refer to one selected from a group consisting of a spin-on coating scheme, an electroplating scheme, an atomic layer deposition scheme, a physical-based vapor deposition scheme, a chemical-based vapor deposition scheme, a conformal deposition scheme, a non-conformal deposition scheme and a combination thereof. An etch scheme, for example, a partial etch scheme, a main etch scheme or an etchback scheme, involved in the present disclosure may refer to one selected form a group consisting of a dry etch scheme, a wet etch scheme, an isotropic etch scheme, an non-isotropic etch scheme and a combination thereof. A polishing scheme involved in the present disclosure may refer to a chemical mechanical polishing scheme.

A dielectric layer, for example, a first dielectric layer, a second dielectric layer or a dielectric, involved in the present disclosure may include one selected from a group consisting of an extremely low-k material, a SiO2 a SiC, a SiCN, a SiCOH, a Si3N4 and a combination thereof. A barrier layer, for example, a first barrier layer or a second barrier layer, involved in the present disclosure includes a material being one selected from a group consisting of a metal alloy material, a TiN, a TaN, TixTayNz, a WNx, an Al, a WSiN, a TiWN, a CoWB, a CoWP and a combination thereof.

Referring now to FIGS. 1 to 12, which show a first embodiment in accordance with the present disclosure with a series of transition structures of a semiconductor structure in a back-end-of-line (BEOL) fabricating stage.

FIG. 1 illustrates an initial structure in the semiconductor structure fabricated in accordance with the present disclosure. In FIG. 1, an initial structure is preliminarily provided and has a configuration formed by a base layer 101, a metallized layer 102 having a dielectric 103 and a metallic pattern (also referred to as metal portion) 104 embedded in the dielectric 103 where the metallized layer 102 is formed on the base layer 101, an etch stop layer 105 deposited on the metallized layer 102, a first dielectric layer 106 deposited on the etch stop layer 105 and a first hard mask layer 107 deposited on the first dielectric layer 106.

Figure 2:
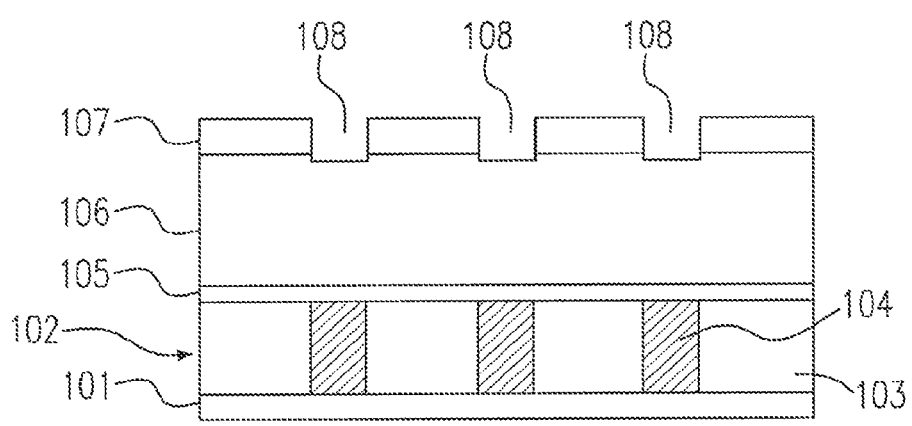
FIG. 2 is a schematic diagram illustrating a patterned first hard mask layer for the semiconductor structure fabricated in accordance with the present disclosure.

FIG. 2 illustrates a patterned first hard mask layer in the semiconductor structure fabricated in accordance with the present disclosure. In FIG. 2, the first hard mask layer 107 is patterned to have a first opening 108 with a specific pattern by implementing a photolithographic multiple patterning scheme, for example, a double patterning scheme, wherein the first opening 108 may vertically penetrate through the first hard mask layer 107 and slightly extend into the first dielectric layer 106. The specific pattern carries a desired metal fill pattern to be transferred to the underlying first dielectric layer 106 through the first opening 108 formed on the first hard mask layer 107.

Figure 3:
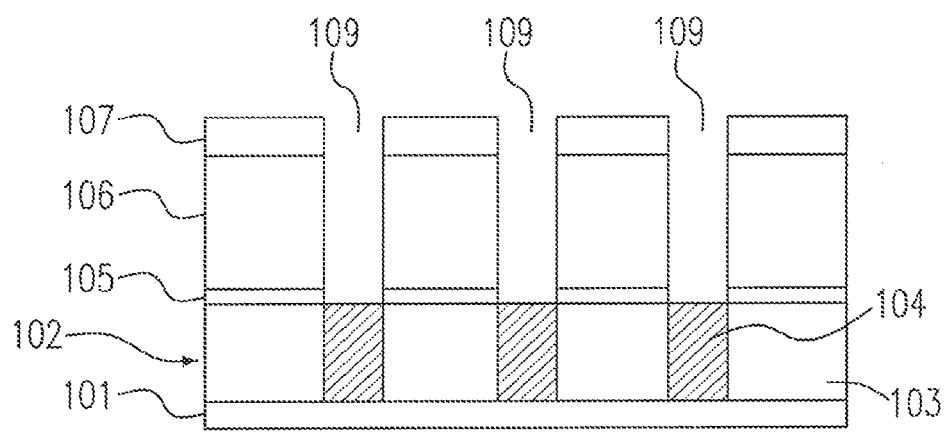
FIG. 3 is a schematic diagram illustrating vias etched into the first dielectric layer for the semiconductor structure fabricated in accordance with the present disclosure.

FIG. 3 illustrates vias etched into the first dielectric layer in the semiconductor structure fabricated in accordance with the present disclosure. In FIG. 3, the first opening 108 is further deepen downwardly to form via 109 that penetrates both the first dielectric layer 106 and the etch stop layer 105 down to a level that is coplanar with the metallized layer 102 by implementing an etch scheme, so that the first opening 108 is transformed to the via 109 and the desired metal fill pattern is etched and correspondingly transferred into the dielectric layer 106. Each of the vias 109 formed in the first dielectric layer 106 is aligned with the respective metallic pattern 104.

Figure 4:
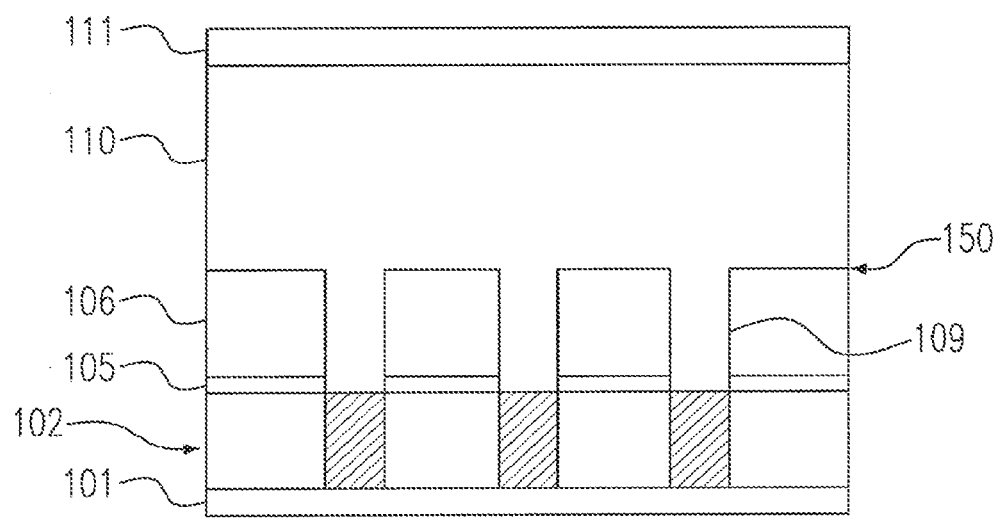
FIG. 4 is a schematic diagram illustrating an intermediate sacrificial layer covering over the vias and the first dielectric layer for the semiconductor structure fabricated in accordance with the present disclosure.

FIG. 4 illustrates an intermediate sacrificial layer covering over the vias and the first dielectric layer in the semiconductor structure fabricated in accordance with the present disclosure. After the vias 109 shown in FIG. 3 is etched, a top part of the formed structure roughly including the first hard mask 107 and a top portion of the first dielectric layer 106 may be removed by using, for example a wet etch scheme. In FIG. 4, an intermediate sacrificial layer 110 is then deposited to fill in the respective vias 109 and further cover over the vias 109 and the first dielectric layer to a target thickness by using a deposition scheme. There is an interface level 150 existing between the intermediate sacrificial layer 110 and a surface that is coplanar with an uppermost surface of the first dielectric layer 106. Subsequently, a second hard mask layer 111 is deposited onto the intermediate sacrificial layer 110.

The intermediate sacrificial layer 110 may be a conductive material and include a material being one selected from a group consisting of metal alloy material, a TiN, a TaN, TixTayNz, a WNx, an Al, a WSiN, a TiWN, a CoWB, a CoWP and a combination thereof. The intermediate sacrificial layer 110 may also be metal materials that are applicable as a barrier layer and can be removed by for example a wet etch scheme. The intermediate sacrificial layer 110 behaves as a transitional layer that is to be removed in the later coming fabricating processes and is not involved in a finalized semiconductor structure fabricated.

Figure 5:
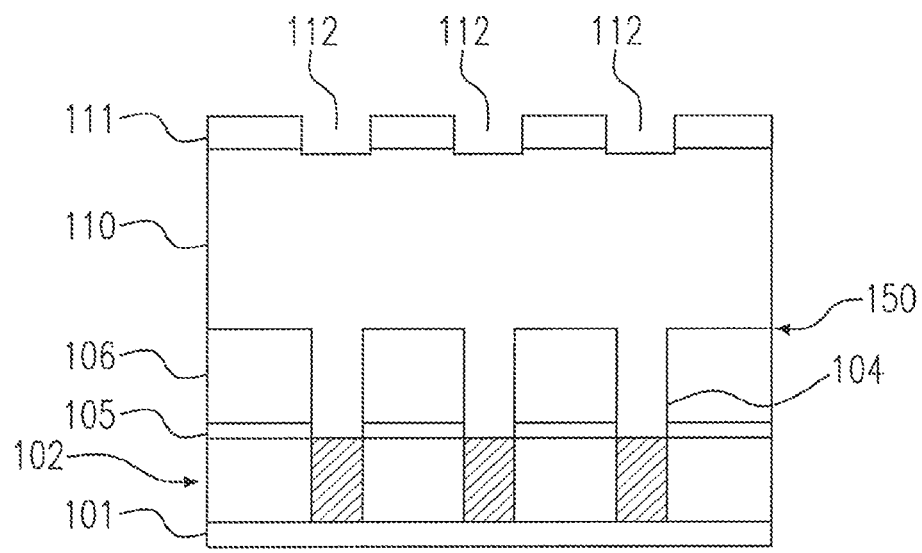
FIG. 5 is a schematic diagram illustrating a patterned second hard mask layer for the semiconductor structure fabricated in accordance with the present disclosure.

FIG. 5 illustrates a patterned second hard mask layer in the semiconductor structure fabricated in accordance with the present disclosure. In FIG. 5, the second hard mask layer 111 is then patterned to have a second opening 112 with a specific pattern consistent with the above-mentioned desired metal fill pattern by implementing a photolithographic multiple patterning scheme, for example, a double patterning scheme, wherein the second opening 112 may vertically penetrate through the second hard mask layer 111 and slightly extend into the intermediate sacrificial layer 110.

Figure 6:
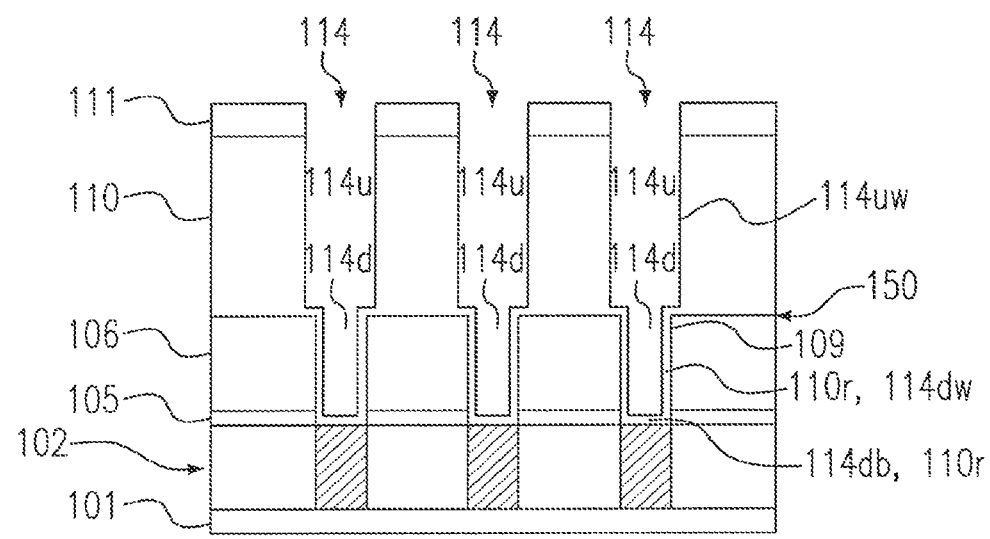
FIG. 6 is a schematic diagram illustrating a trench etched into the intermediate sacrificial layer including an upper trench and a lower trench for the semiconductor structure fabricated in accordance with the present disclosure.

FIG. 6 illustrates a composite trench including an upper trench and a lower trench etched into the intermediate sacrificial layer in the semiconductor structure fabricated in accordance with the present disclosure. In FIG. 6, the second opening 112 is further etched downwardly to form a composite trench 114 having a shape that is wide in top and narrow in bottom as shown in FIG. 6 by using for example a via first trench last scheme, a trench first via last scheme a self-aligned via first scheme, a partial etch scheme and a main etch scheme. The composite trench 114 has a depth that may be controlled to not penetrate the intermediate sacrificial layer 110 and to stop at a level ranged within a thickness of the etch stop layer 105.

The composite trench 114 includes two portions an upper trench 114*u* that is relatively wide and roughly situated above the interface level 150 and a lower trench 114*d* that is relatively narrow and roughly situated below the interface level 150. The lower trench 114*d* is etched into the intermediate sacrificial layer 110 deposited in the via 109 and is in conformity with the via 109. Each of the composite trench 114 etched in the intermediate sacrificial layer 110 is aligned with the respective vias 109 and does not penetrate the intermediate sacrificial layer 110.

The upper trench 114u has an upper sidewall 114uw that is formed by the intermediate sacrificial layer 110 remained above the interface 150. The lower trench 114d in conformity with the via 109 has a lower sidewall 114dw and a lower bottom 114db that are formed by a thin remaining layer 110r of the intermediate sacrificial layer 110 roughly below the interface level 150. During etching process, it is controlled to leave a thin remaining layer 110r of the intermediate sacrificial layer 110 to be remained in and in conformality with the via 109 so as to form the lower sidewall 114dw and a lower bottom 114db for the lower trench 114d. The lower sidewall 114dw and a lower bottom 114db is prepared to behave as a barrier layer.

Figure 7:
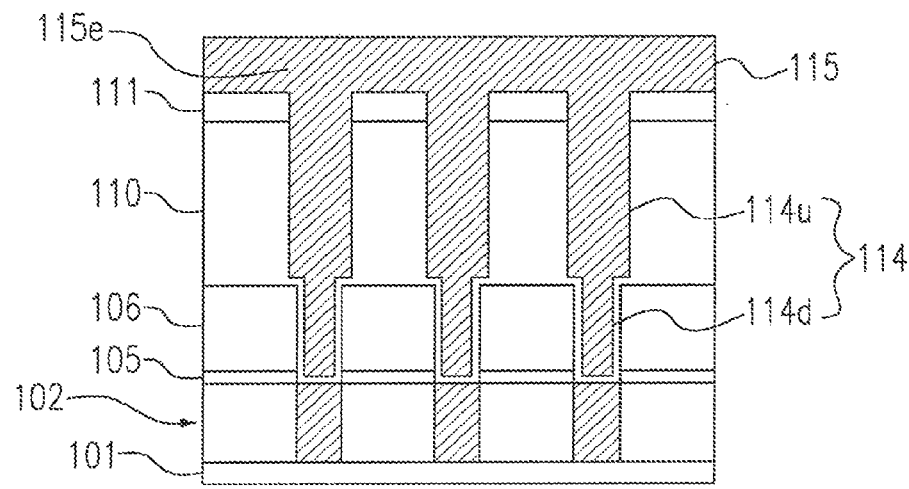
FIG. 7 is a schematic diagram illustrating a conductive filling layer filled in the trench and excessively outside the trench to cover over the second hard mask layer for the semiconductor structure fabricated in accordance with the present disclosure.

FIG. 7 illustrates a conductive filling layer filled in the composite trench and excessively outside the composite trench to cover over the second hard mask layer in the semiconductor structure fabricated in accordance with the present disclosure. In FIG. 7, a conductive filling layer 115 made of such as copper, aluminum or tungsten is filled into the composite trench 114 by using a deposition scheme, in particular an electroplating scheme. The conductive filling layer 115 is usually excessively overfilled the composite trench 114, resulting in an excess filling part 115e that covers over the second hard mask layer 111 after the deposition. Since the upper sidewall 114uw, the lower sidewall 114dw and the lower bottom 114db of the composite trench 114 are all made of the metal material (intermediate sacrificial layer 110), there is none of a seed layer required to be conformally filmed in the composite trench 114 before filling, as well as there is none of a barrier layer required to be formed in the composite trench 114 before filling, which can improve overall R×C delay performance for the finalized semiconductor structure.

Figure 8:
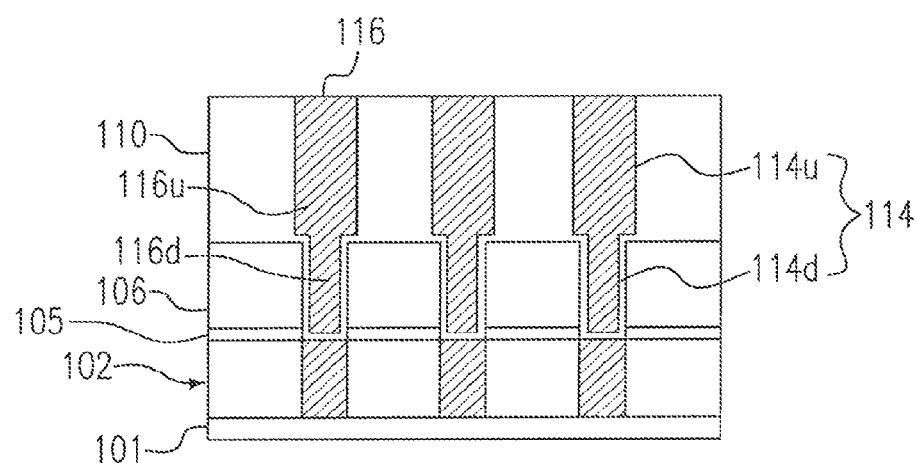
FIG. 8 is a schematic diagram illustrating a conductive fill for the semiconductor structure fabricated in accordance with the present disclosure.

FIG. 8 illustrates a conductive fill in the semiconductor structure fabricated in accordance with the present disclosure. An etch scheme or a polishing scheme is employed to remove a top part of the formed semiconductor structure as shown in FIG. 7 roughly including the excess filling part 115e, the second hard mask layer 11 and a top portion of the intermediate sacrificial layer 110 until the intermediate sacrificial layer 110 is exposed. Thus the conductive filling layer 115 is transformed into a conductive fill 116 inlaid in the composite trench 114 and embedded into the intermediate sacrificial layer 110. The conductive fill 116 includes an upper fill part 116u filled within the upper trench 114u and a lower fill part 116d filled within the lower trench 114d.

Figure 9:
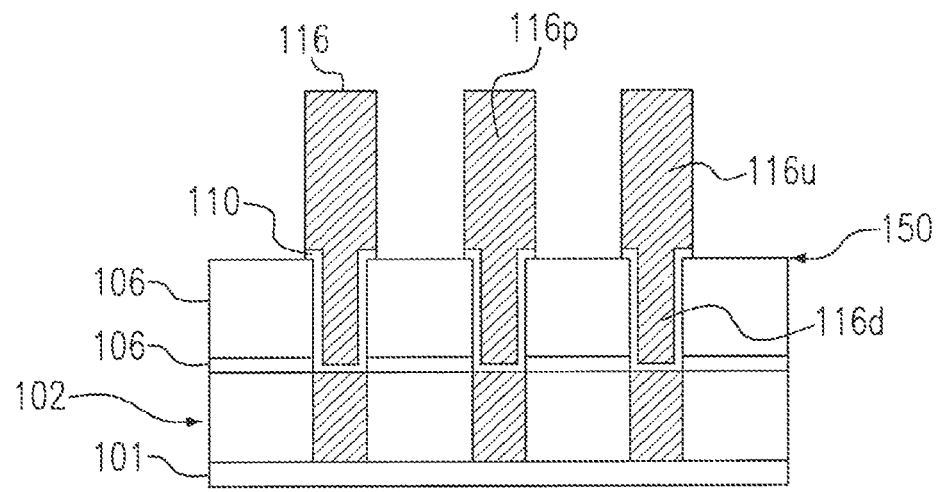
FIG. 9 is a schematic diagram illustrating a protruded part of the conductive fill for the semiconductor structure fabricated in accordance with the present disclosure.

FIG. 9 illustrates a protruded part of the conductive fill in the semiconductor structure fabricated in accordance with the present disclosure. In FIG. 9, an etch scheme, in particular a wet etch scheme, is implemented downwardly to remove the intermediate sacrificial layer 110 filled in spaces among the conductive fill 116 above the interface 150, to uncover a part, referred to as a protruded conductive fill 116p, of the conductive fill 116 above the interface level 150 and protruded from the first dielectric layer 106. The protruded conductive fill 116p includes the upper fill part 116u and a part of the lower fill part 116d. There exists a little amount of the intermediate sacrificial layer 110 remained above the interface level 150 at a joining position for the upper fill parts 116u and the lower fill parts 116d.

Figure 10:
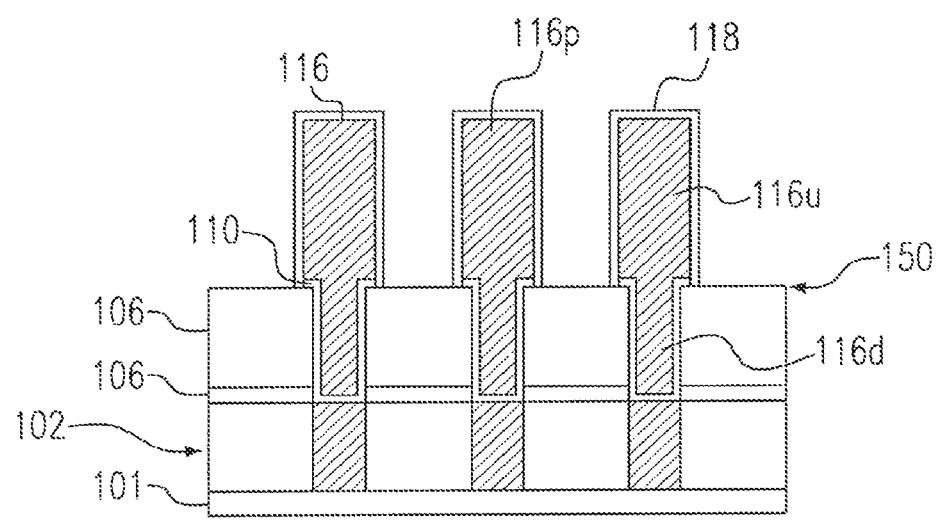
FIG. 10 is a schematic diagram illustrating a second barrier layer conformally encompassing the protruded part of the conductive fill for the semiconductor structure fabricated in accordance with the present disclosure.
Figure 11:
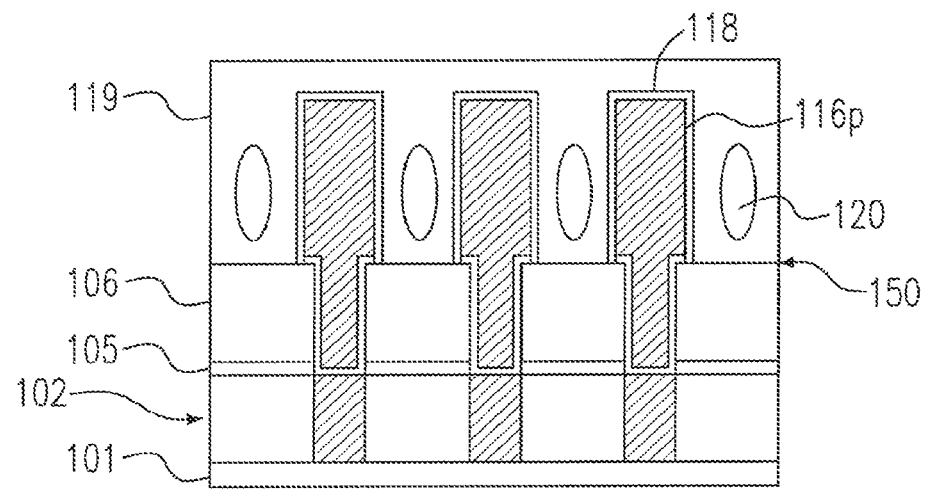
FIG. 11 is a schematic diagram illustrating a second dielectric layer for the semiconductor structure fabricated in accordance with the present disclosure.

FIG. 10 illustrates a second barrier layer conformally encompassing the protruded part of the conductive fill in the semiconductor structure fabricated in accordance with the present disclosure. In FIG. 10, a second barrier layer 118 is formed to conformally encompass the protruded conductive fill 116p by a deposition scheme. FIG. 11 illustrates a second dielectric layer in the semiconductor structure fabricated in accordance with the present disclosure. In FIG. 11, a second dielectric layer 119 is deposited to refill into spaces among and to cover over the protruded conducive parts 116p encompassed with the second barrier layer 118 above the first dielectric layer 106, by particularly using a non-conformal deposition scheme. Due to the non-conformal deposition scheme, air gaps 120 can be formed into the filled second dielectric layer 119, which effectively reduces the entire dielectric constant (k) as well as improves the entire capacitance for the second dielectric layer 119 and overall R×C delay performance for the finalized semiconductor structure.

Figure 12:
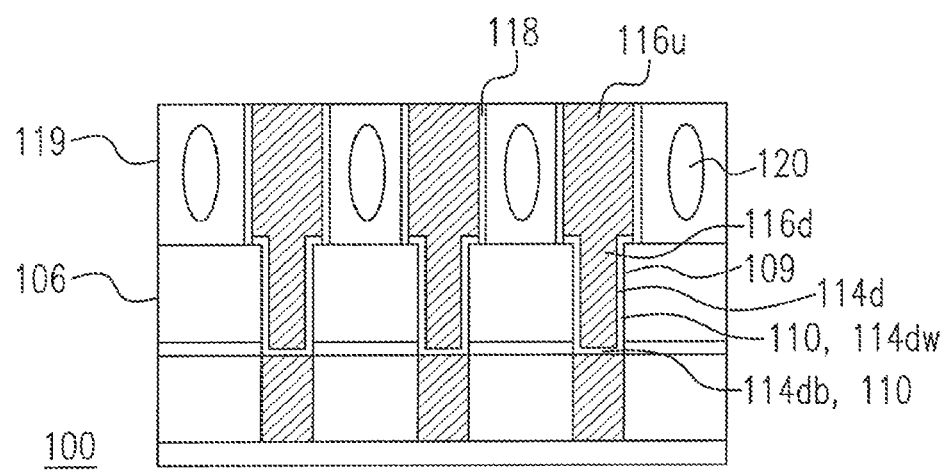
FIG. 12 is a schematic diagram illustrating a finalized semiconductor structure fabricated in accordance with the present disclosure.

FIG. 12 illustrates a finalized semiconductor structure in a semiconductor structure fabricated in accordance with the present disclosure. In FIG. 12, an etchback scheme or a polishing scheme is employed to globally modify and planarize a top part of the formed semiconductor structure as shown in FIG. 11 roughly including respective top portions of the second dielectric layer 119, the second barrier layer 118 and the conductive fill 116 to a target thickness, such that a finalized semiconductor structure 100 is fabricated.

The intermediate sacrificial layer 110 filled in the vias 109, behaving as the lower sidewall 114dw and the lower bottom 114db for the lower trench 114d and existing between the lower fill part 116d and the first dielectric layer 106 functions as a barrier layer, referred to as a first barrier layer for the lower fill part 116d. The second barrier layer 118 surrounding the upper fill part 116u and existing between the upper fill part 116u and the second dielectric layer 119 functions as a barrier layer, referred to as the second barrier layer for the upper fill part 116u.

Therefore, it is apparent that the first barrier layer for the lower fill part 116d and the second barrier layer for the upper fill part 116u may be made of one of the same material and different materials. In one embodiment that the first barrier layer and the second barrier layer are made of one of different materials, the resistance for the formed semiconductor structure can be improved.

In the finally fabricated semiconductor structure 100, the first dielectric layer 106 and the second dielectric layer 119 may be made of one of the same material and different materials. In particular, as compared with the conventional technology, for example a dual damascene technology, since the second dielectric layer 119 is totally free from being worsened or damaged by the etchants, such as etch plasma, it can possesses a relatively low-k than the conventional damaged dielectric layer and correspondingly has good capacitance and well R×C characteristic certainly.

Referring now to FIGS. 13 to 19, which show a second embodiment in accordance with the present disclosure with a series of transition structures of a semiconductor structure in a back-end-of-line (BEOL) fabricating stage.

Figure 13:
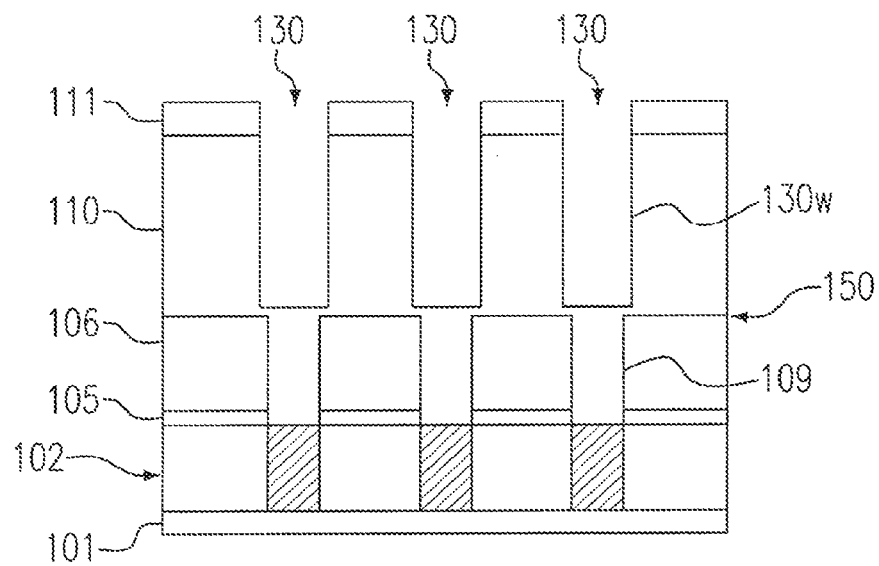
FIG. 13 is a schematic diagram illustrating a simple trench etched into the intermediate sacrificial layer in the semiconductor structure fabricated in accordance with the present disclosure.

FIG. 13 illustrates a simple trench etched into the intermediate sacrificial layer in the semiconductor structure fabricated in accordance with the present disclosure. Continuing with FIGS. 5 to 6, with the miniaturized development for semiconductor fabricating technology for sub-micron, or even for 20 nm node or beyond semiconductor technology, the geometric dimensions, such as width, for a trench or a via become more and more small, and the lower trench 114d as shown in FIG. 6 may be hardly etched. Therefore, in FIG. 13, the second opening 112 is further etched downwardly to stop at around the interface 150 and not to descend down to the interface 150 to from a simple straight trench 130 by using an etch scheme. The intermediate sacrificial layer 110 is remained in the via 109.

Figure 14:
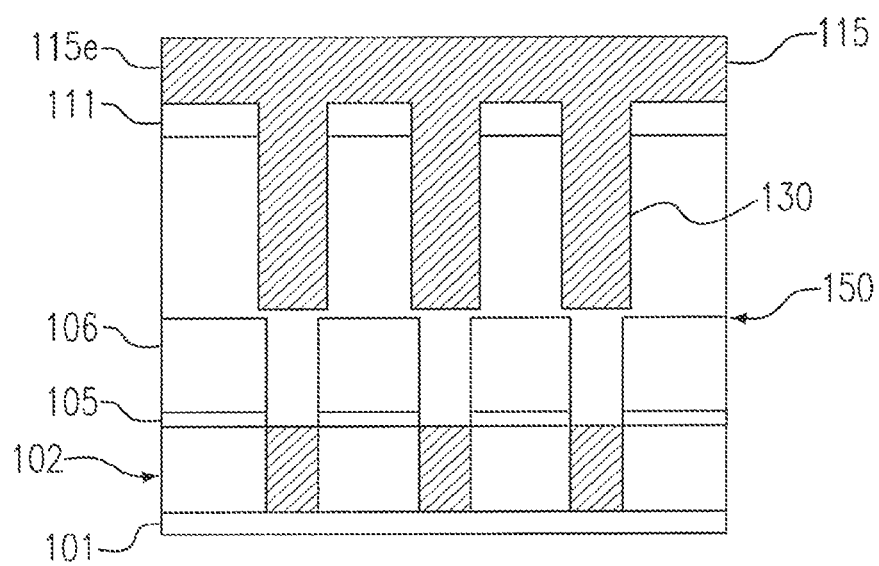
FIG. 14 is a schematic diagram illustrating a conductive filling layer filled in the simple trench and excessively outside the simple trench to cover over the second hard mask layer in the semiconductor structure fabricated in accordance with the present disclosure.

FIG. 14 illustrates a conductive filling layer filled in the simple trench and excessively outside the simple trench to cover over the second hard mask layer in the semiconductor structure fabricated in accordance with the present disclosure. In FIG. 14, a conductive filling layer 115 which may be copper is filled into and excessively overfilled the simple trench 130 to cover over the second hard mask layer 111. There is none of a seed layer or a barrier layer required to be formed in the simple trench 130 before filling.

Figure 15:
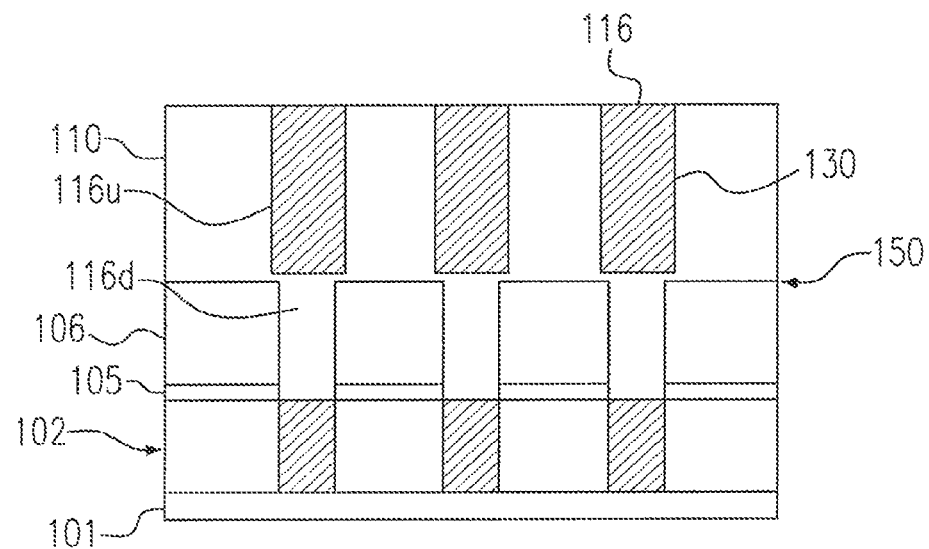
FIG. 15 is a schematic diagram illustrating a conductive fill in the semiconductor structure fabricated in accordance with the present disclosure.

FIG. 15 illustrates a conductive fill in the semiconductor structure fabricated in accordance with the present disclosure. The formed semiconductor structure as shown in FIG. 14 is polished and modified to expose the intermediate sacrificial layer 110. Thus the conductive fill 116 inlaid in the simple trench 130 and embedded into the intermediate sacrificial layer 110 is formed.

Figure 16:
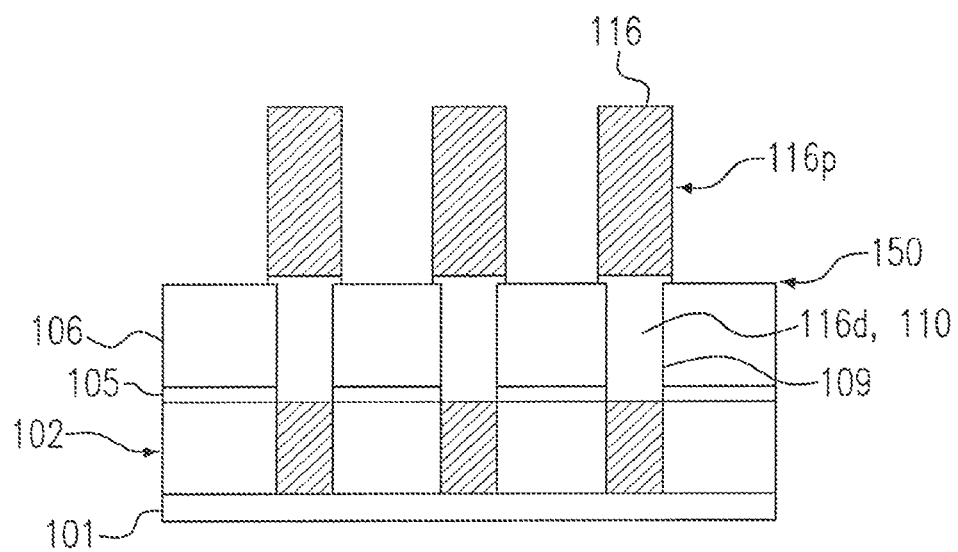
FIG. 16 is a schematic diagram illustrating a protruded part of the conductive fill in the semiconductor structure fabricated in accordance with the present disclosure.

FIG. 16 illustrates a protruded part of the conductive fill in the semiconductor structure fabricated in accordance with the present disclosure. In FIG. 16, an etch scheme, in particular a wet etch scheme, is implemented downwardly to remove the intermediate sacrificial layer 110 filled in spaces among the conductive fill 116 above the interface level 150 to render the conductive fill 116 to be protruded from the first dielectric layer 106 to form a protruded conductive fill 116p. In this second embodiment, the lower conductive fill 116d is made of the intermediate sacrificial layer 110 filled in the vias 109.

Figure 17:
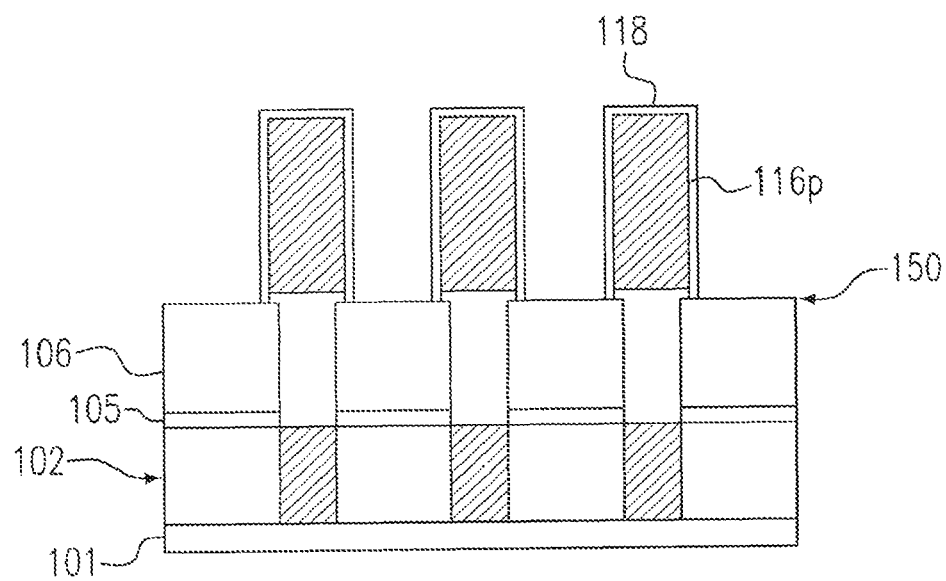
FIG. 17 is a schematic diagram illustrating a second barrier layer conformally encompassing the protruded conductive fill in the semiconductor structure fabricated in accordance with the present disclosure.
Figure 18:
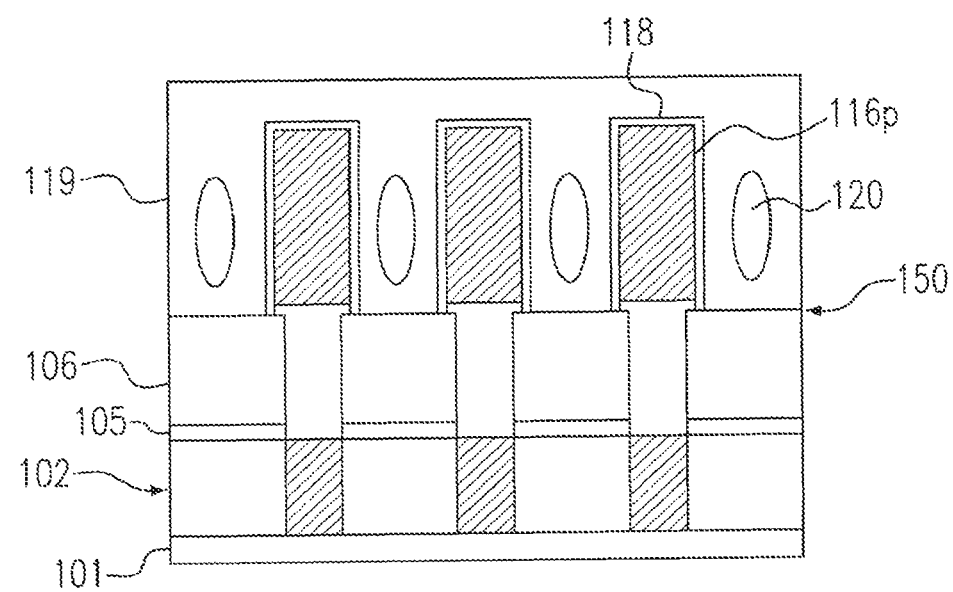
FIG. 18 is a schematic diagram illustrating a second dielectric layer in the semiconductor structure fabricated in accordance with the present disclosure.

FIG. 17 illustrates a second barrier layer conformally encompassing the protruded conductive fill in the semiconductor structure fabricated in accordance with the present disclosure. In FIG. 17, a second barrier layer 118 is formed to conformally encompass the protruded conductive fill 116p by deposition scheme. FIG. 18 illustrates a second dielectric layer in the semiconductor structure fabricated in accordance with the present disclosure. In FIG. 18, a second dielectric layer 119 is deposited to refill into spaces among and to cover over the protruded conductive fill 116p encompassed with the second barrier layer 118 above the first dielectric layer 106, by particularly using a non-conformal deposition scheme. Due to the non-conformal deposition scheme, there are air gaps 120 formed in the filled second dielectric layer 119, which effectively reduces the entire dielectric constant (k) as well as improves the entire capacitance for the second dielectric layer 119.

Figure 19:
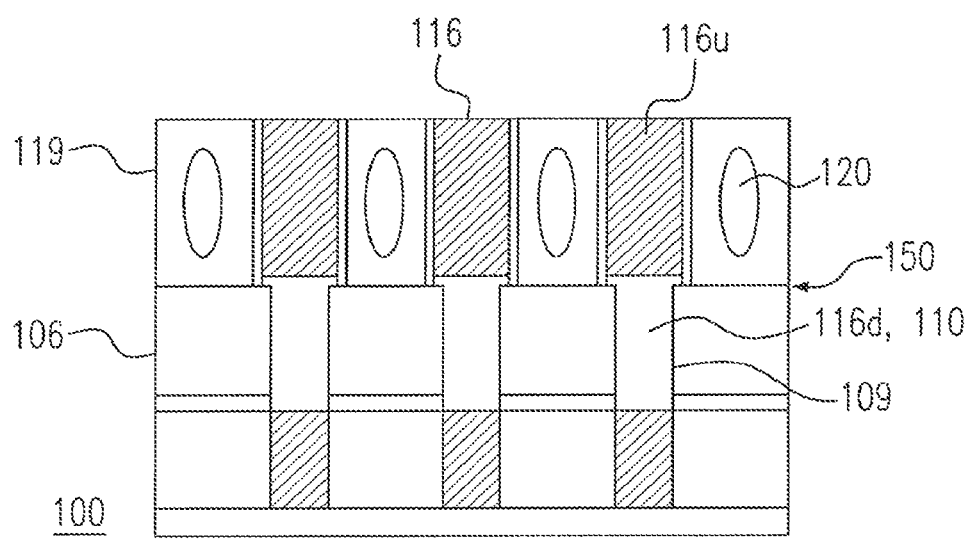
FIG. 19 is a schematic diagram illustrating a finalized semiconductor structure in a semiconductor structure fabricated in accordance with the present disclosure.

FIG. 19 illustrates a finalized semiconductor structure in a semiconductor structure fabricated in accordance with the present disclosure. In FIG. 19, an etchback scheme or a polishing scheme is employed to globally modify and planarize the formed semiconductor structure as shown in FIG. 18 to a target thickness, such that a finalized semiconductor structure 100 is fabricated. In this second embodiment, the lower conductive fill 116d is made of the intermediate sacrificial layer 110 filled in the vias 109.

Figure 20:
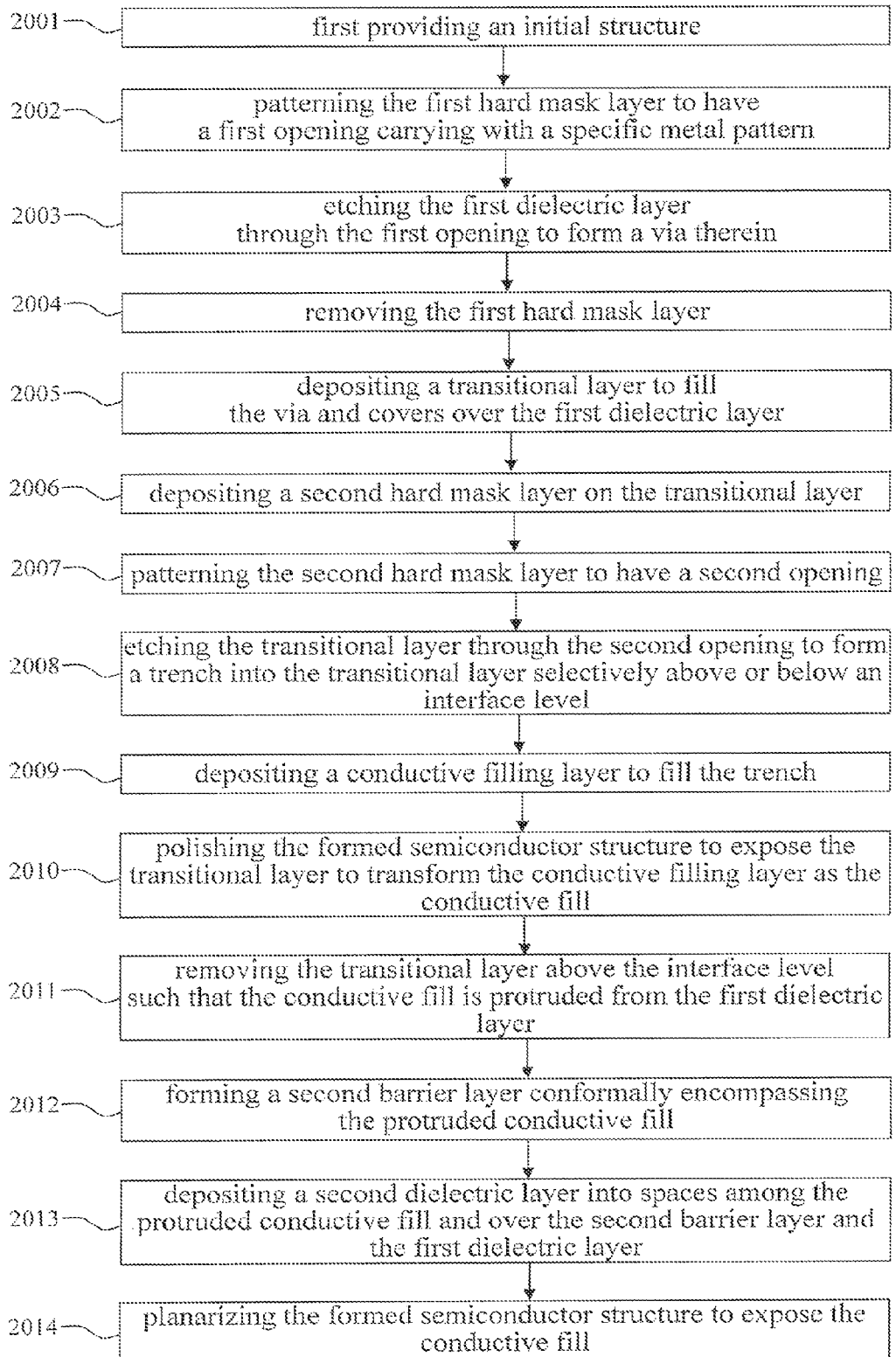
FIG. 20 is a flow chart illustrating the semiconductor fabricating process forming a semiconductor structure in accordance with the present disclosure.

To sum up the processes for forming a series of above-mentioned transition structures of a semiconductor structure, a semiconductor fabricating process can be accordingly provided. Referring now to FIG. 20, which is a flow chart illustrating the semiconductor fabricating process forming a semiconductor structure in accordance with the present disclosure.

In step 2001, first providing an initial structure including a base layer, a metallized layer having a dielectric and a metallic pattern embedded in the dielectric where the metallized layer is formed on the base layer, an etch stop layer deposited on the metallized layer, a first dielectric layer deposited on the etch stop layer and a first hard mask layer deposited on the first dielectric layer. In step 2002, patterning the first hard mask layer to have a first opening carrying with a specific metal pattern. In step 2003, etching the first dielectric layer through the first opening to form a via therein. In step 2004, removing the first hard mask layer. In step 2005, depositing a transitional layer to fill the via and covers over the first dielectric layer. In step 2006, depositing a second hard mask layer on the transitional layer. In step 2007, patterning the second hard mask layer to have a second opening. In step 2008, etching the transitional layer through the second opening to form a trench into the transitional layer selectively above or below an interface level at an uppermost surface of the first dielectric layer. In step 2009, depositing a conductive filling layer to fill the trench. In step 2010, polishing the formed semiconductor structure to expose the transitional layer to transform the conductive filling layer as the conductive fill. In step 2011, removing the transitional layer above the interface level such that the conductive fill is protruded from the first dielectric layer. In step 2012, forming a second barrier layer conformally encompassing the protruded conductive fill. In step 2013, depositing a second dielectric layer into spaces among the protruded conductive fill and over the second barrier layer and the first dielectric layer. In step 2014, planarizing the formed semiconductor structure to expose the conductive fill.

In brief, the present disclosure also provides an ELK refilling method which does not only prevent the ELK layer from being damaged but also forms air gap in the ELK layer to improve overall capacitance for the finalized semiconductor device. Due to ELK refilling process, there is none of ELK damages occurring which may correspondingly improve capacitance for the semiconductor device containing the ELK layer.

There are further embodiments provided as follows.

Embodiment 1 a semiconductor fabricating process includes providing a first dielectric layer, a transitional layer formed on the first dielectric layer, and a conductive fill penetrated through the transitional layer and into the first dielectric layer; removing the transitional layer; and forming a second dielectric layer over the conductive fill and the first dielectric layer.

Embodiment 2 the process according to the above-mentioned embodiment, the first dielectric layer and the second dielectric layer are made of an extremely low-k material, and the first dielectric layer and the second dielectric layer are made of one of the same material and different materials.

Embodiment 3 the process according to one of the above-mentioned embodiments, the transitional layer includes a material being one selected from a group consisting of a metal alloy material, a TiN, a TaN, TixTayNz, a WNx, an Al, a WSiN, a TiWN, a CoWB, a CoWP and a combination thereof.

Embodiment 4 the process according to any one of the above-mentioned embodiments further includes providing an initial structure formed by a base layer, a metallized layer having a dielectric and a metal portion formed in the dielectric, where the metallized layer is formed on the base layer, an etch stop layer deposited on the metallized layer, a first dielectric layer deposited on the etch stop layer and a first hard mask layer deposited on the first dielectric layer; patterning the first hard mask layer to have a first opening having a first pattern and penetrating through the first hard mask layer by a first multiple patterning scheme; etching the first dielectric layer through the first opening to form a via extending through the first dielectric layer down to the metal portion; removing the first hard mask layer; depositing the transitional layer to fill the via and cover the first dielectric layer; depositing a second hard mask layer on the transitional layer; patterning the second hard mask layer to have a second opening having a second pattern and penetrating through the second hard mask layer by a second multiple patterning scheme; etching the transitional layer through the second opening to form a trench extending into the transitional layer above an interface level that is coplanar with an uppermost surface of the first dielectric layer, and selectively descending into the transitional layer below the interface level; depositing a conductive filling layer to fill the trench and excessively cover the second hard mask layer; and polishing the whole second hard mask layer and respective top portions of the conductive filling layer and the transitional layer to expose the transitional layer such that the conductive filling layer deposited within the trench is formed as the conductive fill.

Embodiment 5 the process according to any one of the above-mentioned embodiments, the conductive filling layer is formed by performing a deposition scheme being one selected from a group consisting of an electroplating deposition scheme, an atomic layer deposition scheme, a physical-based vapor deposition scheme and a chemical-based vapor deposition scheme.

Embodiment 6 the process according to any one of the above-mentioned embodiments, the via is etched in alignment with the metal portion, and the trench is etched in alignment with the via by sequentially performing a partial etch scheme and a main etch scheme in accordance with the second pattern.

Embodiment 7 the process according to any one of the above-mentioned embodiments, the trench includes an upper trench above the interface level and a lower trench below the interface level in the transitional layer.

Embodiment 8 the process according to any one of the above-mentioned embodiments, the transitional layer deposited above the interface level and remained after the main etching is formed as an upper sidewall for the upper trench, and the transitional layer deposited below the interface level and remained after the main etching is formed as a lower sidewall in conformity with the via for the lower trench.

Embodiment 9 the process according to any one of the above-mentioned embodiments, the conductive fill includes an upper part filled within the upper trench and above the interface level, and a lower part filled within the lower trench and below the interface level.

Embodiment 10 the process according to any one of the above-mentioned embodiments, the lower sidewall in the lower trench functions as a first barrier layer for the lower part.

Embodiment 11 the process according to any one of the above-mentioned embodiments further includes removing the transitional layer above the interface level such that the conductive fill is protruded from the first dielectric layer; forming a second barrier layer conformally encompassing the protruded conductive fill; depositing the second dielectric layer over the second barrier layer and the first dielectric layer; and polishing respective top portions of the second dielectric layer, the second barrier layer and the conductive fill to expose the conductive fill.

Embodiment 12 the process according to any one of the above-mentioned embodiments, the second barrier layer is formed by performing a deposition scheme being one selected from a group consisting of an atomic layer deposition scheme, a physical-based vapor deposition scheme and a chemical-based vapor deposition scheme.

Embodiment 13 the process according to any one of the above-mentioned embodiments, the first barrier layer and the second barrier layer includes a material being one selected from a group consisting of a metal alloy material, a TiN, a TaN, TixTayNz, a WNx, an Al, a WSiN, a TiWN, a CoWB, a CoWP and a combination thereof, and the first barrier layer and the second barrier layer are made of one of the same material and different materials.

Embodiment 14 the process according to any one of the above-mentioned embodiments, the second dielectric layer is deposited by performing a deposition scheme being one selected from a group consisting of a non-conformal chemical vapor deposition scheme, a conformal chemical vapor deposition scheme, an atomic layer deposition scheme, a physical-based vapor deposition scheme and a chemical-based vapor deposition scheme.

Embodiment 15 the process according to any one of the above-mentioned embodiments, the second dielectric layer includes an air gap formed by the non-conformal chemical vapor deposition scheme.

Embodiment 16 a semiconductor damascene structure includes a first dielectric layer; and a second dielectric layer formed on the first dielectric layer and having a material dielectric constant and a processed dielectric constant, wherein the material dielectric constant and the processed dielectric constant have a magnitude difference having an absolute value less than 0.3.

Embodiment 17 the structure according to the above-mentioned embodiment, the magnitude difference has an absolute value in a range from 0 to 0.2.

Embodiment 18 the structure according to one of the above-mentioned embodiments further includes a conductive fill formed through the second dielectric layer and into the first dielectric layer.

Embodiment 19 a semiconductor structure includes a first dielectric layer; a second dielectric layer formed on the first dielectric layer; a conductive filling having an upper part penetrated through the second dielectric layer, and a lower part penetrated into the first dielectric layer; a first barrier layer formed between the lower part and the first dielectric layer; and a second barrier layer formed between the upper part and the second dielectric layer, wherein the first barrier layer and the second barrier layer are made of different materials.

Embodiment 20 a semiconductor structure includes a dielectric layer; an intermediate sacrificial layer formed on the dielectric layer; and a conductive fill formed in the intermediate sacrificial layer and the dielectric layer.

While the disclosure has been described in terms of what are presently considered to be the most practical and preferred embodiments, it is to be understood that the disclosure need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

The invention claimed is:

1. A structure comprising:
a first dielectric layer;
an opening in the first dielectric layer;
a first conductive feature, wherein an entirety of top surfaces of the first conductive feature is higher than the first dielectric layer, and the first conductive feature comprising:
  a first portion in the opening, wherein the first portion of the first conductive feature contacts sidewalls of the first dielectric layer, with the sidewalls facing the opening; and
  a second portion over the first dielectric layer, with the second portion having a first edge;
a second conductive feature over the first conductive feature, wherein the first and the second conductive features are formed of different materials, and the second conductive feature comprises a second edge aligned with the first edge; and
a barrier layer along the second edge of the second conductive feature.

2. The structure of claim 1, wherein a top surface of the barrier layer is coplanar with a top surface of the second conductive feature.

3. The structure of claim 1, wherein the barrier layer extends along the first edge.

4. The structure of claim 3, wherein the barrier layer comprises a bottom end contacting a top surface of the first dielectric layer.

5. The structure of claim 1, wherein the second conductive feature extends into the first dielectric layer.

6. The structure of claim 1, wherein the second conductive feature does not extend into the first dielectric layer.

7. The structure of claim 1, further comprising a second dielectric layer at a same level as the second portion of the first conductive feature and the second conductive feature.

8. The structure of claim 7 further comprising an air gap in the second dielectric layer.

9. The structure of claim 1, wherein substantially an entirety of a top surface of the first conductive feature is substantially coplanar.

10. The structure of claim 1, wherein an entirety of the first conductive feature is formed of a homogenous material.

11. A structure comprising:
a conductive pattern;
a first dielectric layer over the conductive pattern;
a metal nitride layer, wherein all top surfaces of the metal nitride layer are higher than a top surface of the first dielectric layer, and the metal nitride layer comprises:
  a first portion in the first dielectric layer, wherein a bottom surface of the first portion is in contact with a top surface of the conductive pattern; and
  a second portion over the first dielectric layer;
a copper-containing feature over and in contact with the metal nitride layer, wherein the copper-containing feature and the second portion of the metal nitride layer are co-terminus; and
a barrier layer contacting an edge of the copper-containing feature.

12. The structure of claim 11, wherein the first portion of the metal nitride layer contacts sidewalls of the first dielectric layer.

13. The structure of claim 11, wherein the second portion of the metal nitride layer comprises a portion overlapping the first dielectric layer.

14. The structure of claim 11, wherein the barrier layer comprises a metal nitride.

15. The structure of claim 11, wherein all top surfaces of the metal nitride layer are higher than all top surface of the first dielectric layer.

16. A structure comprising:
a conductive pattern;
a first dielectric layer over the conductive pattern;
an opening in the first dielectric layer;
a conductive region comprising a bottom surface contacting a top surface of the conductive pattern, wherein the conductive region comprises:
  a first portion filling an entirety of the opening; and
  a second portion over the first dielectric layer, wherein an entirety of the first portion and an entirety of the second portion are formed of a homogenous material;
a copper-containing feature over the conductive region, wherein the copper-containing feature and the second portion of the conductive region have edges co-terminus with each other; and a barrier layer extending on an edge of the second portion of the conductive region and an edge of the copper-containing feature.

17. The structure of claim 16, wherein the copper-containing feature and the second portion of the conductive region are not co-terminus with the first portion of the conductive region.

18. The structure of claim 16, wherein both the conductive region and the barrier layer comprise metal nitrides.

19. The structure of claim 16 further comprising:
a second dielectric layer over the first dielectric layer, with a top surface of the dielectric layer coplanar with a top edge of the barrier layer and a top surface of the copper-containing feature; and
an air gap in the second dielectric layer.

20. The structure of claim 16, wherein the second portion of the conductive region comprises a portion overlapping the first dielectric layer.

* * * * *